(12) United States Patent
Lille (10) Patent No.: US 7,336,449 B2
(45) Date of Patent: Feb. 26, 2008

(54) THREE TERMINAL MAGNETIC SENSOR (TTM) HAVING A METAL LAYER FORMED IN-PLANE AND IN CONTACT WITH THE BASE REGION FOR REDUCED BASE RESISTANCE

(75) Inventor: Jeffrey Scott Lille, Sunnyvale, CA (US)

(73) Assignee: Eitachi Global Storage Technologies Netherlands B.V., Amsterdam (NL)

( * ) Notice: Subject to any disclaimer, the term of this patent is extended or adjusted under 35 U.S.C. 154(b) by 434 days.

(21) Appl. No.: 10/955,758

(22) Filed: Sep. 30, 2004

(65) Prior Publication Data

US 2006/0067003 A1    Mar. 30, 2006

(51) Int. Cl.
*G11B 5/33*    (2006.01)

(52) U.S. Cl. ...................................... 360/313

(58) Field of Classification Search ............... 360/314, 360/324.1, 324.2, 294.7, 313; 257/25, 421
See application file for complete search history.

(56) References Cited

U.S. PATENT DOCUMENTS

| | | | |
|---|---|---|---|
| 5,747,859 A * | 5/1998 | Mizushima et al. | 257/421 |
| 5,973,334 A * | 10/1999 | Mizushima et al. | 257/25 |
| 6,134,089 A | 10/2000 | Barr et al. | |
| 6,466,419 B1 | 10/2002 | Mao | |
| 6,480,365 B1 | 11/2002 | Gill et al. | |
| 6,577,476 B1 | 6/2003 | Childress et al. | |
| 6,654,209 B2 | 11/2003 | Seigler et al. | |
| 6,999,285 B2 * | 2/2006 | Gill | 360/314 |
| 7,184,246 B2 * | 2/2007 | Sasaki et al. | 360/294.7 |
| 2003/0122208 A1 | 7/2003 | Sato et al. | |
| 2003/0214004 A1 | 11/2003 | Sato et al. | |
| 2003/0214763 A1 * | 11/2003 | Childress et al. | 360/324.2 |
| 2006/0023370 A1 * | 2/2006 | Lille | 360/324.1 |

OTHER PUBLICATIONS

P.S. Anil Kumar & J.C. Lodder, "The Spin-Valve Transistor" Applied Physics, Apr. 28, 2000, 2911-2920, United Kingdom.
R. Jansen, "The Spin-Valve Transistor: A Review and Outlook", Journal of Physics, Sep. 17, 2003, R289-R308, Institute of Physics Publishing, United Kingdom.

(Continued)

*Primary Examiner*—Tianjie Chen
(74) *Attorney, Agent, or Firm*—John J. Oskorep, Esq.; Matthew Zises (57) ABSTRACT

A three terminal magnetic sensor (TTM) has a base region, a collector region which is adjacent the base region, an emitter region, and a barrier region which separates the emitter region from the base region. A sensing plane is defined along sides of the base region, the collector region, and the emitter region. An insulator layer is offset from the sensing plane and adjacent the collector region and the base region. A metal layer is offset from the sensing plane and in-plane and in contact with magnetic materials of the base region. This metal layer advantageously reduces an electrical resistance of the base region, which reduces signal noise in the TTM. Preferably, the metal layer has an electrical resistivity of less than 10 μΩ-centimeter (e.g. copper, gold, or ruthenium). The TTM may comprise a spin valve transistor (SVT), a magnetic tunnel transistor (MTT), or a double junction structure.

22 Claims, 12 Drawing Sheets

OTHER PUBLICATIONS

Sebastiaan Van Dijken, Xin Jiang & Stuart S. P. Parkin, "Room Temperature Operation of a High Current Magnetic Tunnel Transistor", "Applied Physics Letters", May 6, 2002, 3364-3366, vol. 80, # 18, American Institute of Physics, United States.

K.C. Hall, Wayne H. Lau, K. Gundogdu, Michael E. Flatte & Thomas F. Boggess, "Non-Mgnetic Semiconductor Spin Transistor", Jul. 28, 2003, 1-5.

* cited by examiner

THREE TERMINAL MAGNETIC SENSOR (TTM) HAVING A METAL LAYER FORMED IN-PLANE AND IN CONTACT WITH THE BASE REGION FOR REDUCED BASE RESISTANCE

BACKGROUND

1. Field of the Technology

This invention relates generally to three terminal magnetic sensors (TTMs) suitable for use in magnetic heads, and more particularly to TTMs having a metal layer formed in-plane and in contact with magnetic materials of the base region for reduced base resistance.

2. Description of the Related Art

Magnetoresistive (MR) sensors have typically been used as read sensors in hard disk drives. An MR sensor detects magnetic field signals through the resistance changes of a read element, fabricated of a magnetic material, as a function of the strength and direction of magnetic flux being sensed by the read element. The conventional MR sensor, such as that used as a MR read head for reading data in magnetic recording disk drives, operates on the basis of the anisotropic magnetoresistive (AMR) effect of the bulk magnetic material, which is typically permalloy. A component of the read element resistance varies as the square of the cosine of the angle between the magnetization direction in the read element and the direction of sense current through the read element. Recorded data can be read from a magnetic medium, such as the disk in a disk drive, because the external magnetic field from the recorded magnetic medium (the signal field) causes a change in the direction of magnetization in the read element, which in turn causes a change in resistance of the read element and a corresponding change in the sensed current or voltage.

A three terminal magnetic sensor (TTM) of a magnetic head may comprise a spin valve transistor (SVT), which is a vertical spin injection device having spin-oriented electrons injected over a barrier layer into a free layer. Those spin-oriented electrons that are not spin-scattered continue to traverse a second barrier. The current over the second barrier is referred to as the magneto-current. Conventional SVTs are constructed using a traditional three-terminal framework having an "emitter-base-collector" structure of a bipolar transistor. SVTs further include a spin valve (SV) on a metallic base region, whereby the collector current is controlled by the magnetic state of the base region using spin-dependent scattering. Although the TTM may be an SVT where both barrier layers are Schottky barriers, the TTM may alternatively incorporate a magnetic tunnel transistor (MTT) where one of the barrier layers is a Schottky barrier and the other barrier layer is a tunnel barrier, or a double junction structure where both barrier layers are tunnel barriers.

Since it is advantageous to form a very thin base region for increased areal recording densities, it has been identified that the base region in the TTM will have a relatively large electrical resistance. Given an estimated trackwidth (TW) of approximately 50 nanometers (nm) for a magnetic head, for example, the electrical resistance of the base region may be much greater than 100 Ω. Thus, as the sense current passes through the base region from the emitter lead to the base lead, the base region may be prone to failure or damage (e.g. it could "blow" like a fuse). Further, a relatively large resistance for the base region raises the noise floor for the TTM, such that a much larger input signal would be required for suitable operation. Accordingly, there is a need to solve these problems so that TTMs may be suitable for use in magnetic heads and other devices.

SUMMARY

In one illustrative embodiment of the present application, a three terminal magnetic sensor (TTM) suitable for use in a magnetic head comprises a base region, a collector region which is adjacent the base region, an emitter region, and a barrier region which separates the emitter region from the base region. A sensing plane of the TTM is defined along sides of the base region, the collector region, and the emitter region. An insulator layer is offset from the sensing plane and adjacent the collector region and the base region. A metal layer is offset from the sensing plane and is in-plane and in contact with magnetic materials of the base region. This metal layer advantageously reduces an electrical resistance of the base region, which reduces signal noise in the TTM. Preferably, the metal layer has an electrical resistivity of less than 10 μΩ-centimeter (e.g. copper, gold, or ruthenium). The TTM may comprise a spin valve transistor (SVT), a magnetic tunnel transistor (MTT), or a double junction structure.

In another illustrative embodiment of the present invention, a TTM suitable for use in a magnetic head has a base region, a collector region which is adjacent the base region, an emitter region having an emitter lead formed thereover, and a barrier region which separates the emitter region from the base region. A sensing plane is defined along sides of the base region, the collector region, and the emitter region. The TTM has a metal layer which is offset from the sensing plane, in-plane and in contact with the emitter region, and in contact with the emitter lead. This metal layer reduces an electrical resistance of the emitter region, which reduces signal noise in the TTM. Preferably, the metal layer has an electrical resistivity of less than 10 μΩ-centimeter (e.g. copper, gold, or ruthenium).

BRIEF DESCRIPTION OF THE DRAWINGS

Other objects and advantages of the invention will become more apparent to those skilled in the art after considering the following detailed description in connection with the accompanying drawings.

FIGS. 7A-16B are illustrations of the TTM being fabricated according to a particular method, preferably in the order presented.

DETAILED DESCRIPTION OF THE PREFERRED EMBODIMENTS

The following description is the best embodiment presently contemplated for carrying out the present invention. This description is made for the purpose of illustrating the general principles of the present invention and is not meant to limit the inventive concepts claimed herein.

Figure 1:
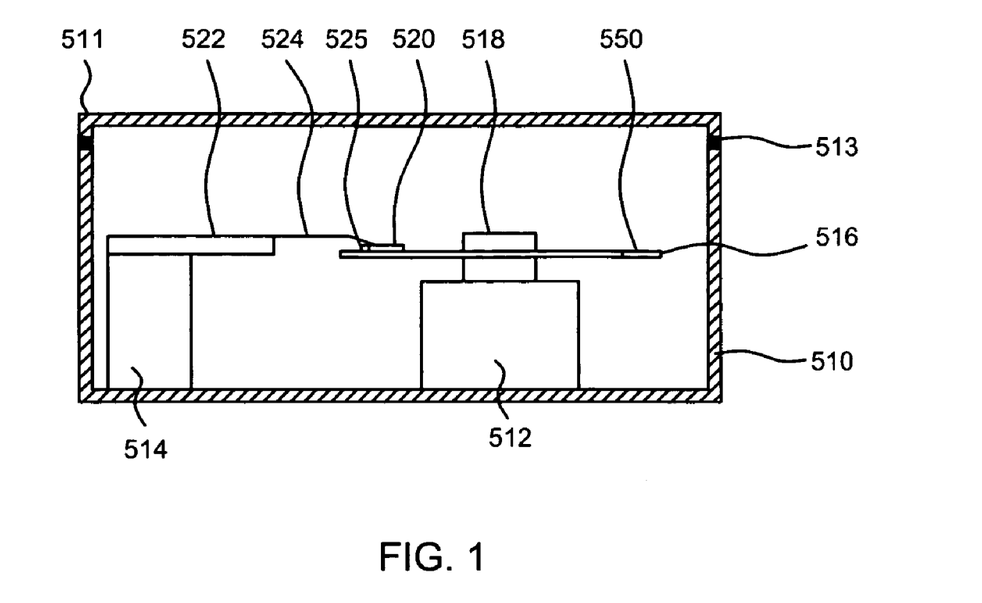
FIG. 1 is a cross-sectional view of a disk drive which may embody a magnetic head having a three terminal magnetic sensor (TTM) comprising a spin valve transistor (SVT)
Figure 2:
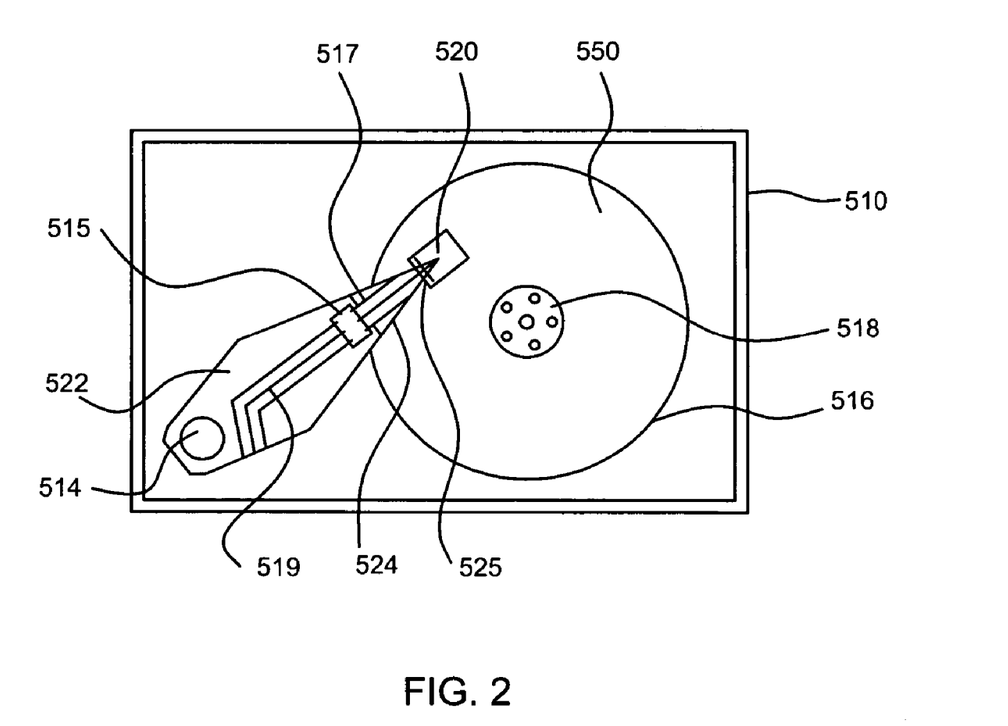
FIG. 2 is a top-down view of the disk drive of FIG. 1.

FIG. 1 is a simplified block diagram of a conventional magnetic recording disk drive for use with a three terminal magnetic sensor (TTM) of a magnetic head. FIG. 2 is a top view of the disk drive of FIG. 1 with the cover removed. Referring first to FIG. 1, there is illustrated in a sectional view a schematic of a conventional disk drive of the type using a TTM. The disk drive comprises a base 510 to which are secured a disk drive motor 512 and an actuator 514, and a cover 511. Base 510 and cover 511 provide a substantially sealed housing for the disk drive. Typically, there is a gasket 513, located between base 510 and cover 511 and a small breather port (not shown) for equalizing pressure between the interior of the disk drive and the outside environment. A magnetic recording disk 516 is connected to drive motor 512 by means of a hub 518 to which it is attached for rotation by drive motor 512. A thin lubricant film 550 is maintained on the surface of disk 516. A read/write head or transducer 525 is formed on the trailing end of a carrier, such as an air-bearing slider 520. Transducer 525 is a read/write head comprising an inductive write head portion and a read head portion. Slider 520 is connected to actuator 514 by means of a rigid arm 522 and a suspension 524. Suspension 524 provides a biasing force which urges slider 520 onto the surface of the recording disk 516. During operation of the disk drive, drive motor 512 rotates disk 516 at a constant speed, and actuator 514, which is typically a linear or rotary voice coil motor (VCM), moves slider 520 generally radially across the surface of disk 516 so that read/write head 525 may access different data tracks on disk 516.

FIG. 2 illustrates in better detail suspension 524 which provides a force to slider 520 to urge it toward disk 516. Suspension 524 may be a conventional type of suspension, such as the well-known Watrous suspension, as described in U.S. Pat. No. 4,167,765. This type of suspension also provides a gimbaled attachment of the slider which allows the slider to pitch and roll as it rides on the air bearing surface. The data detected from disk 516 by transducer 525 is processed into a data readback signal by signal amplification and processing circuitry in an integrated circuit chip 515 located on arm 522. The signals from transducer 525 travel via a flex cable 517 to chip 515, which sends its output signals to the disk drive electronics (not shown) via cable 519.

Figure 3:
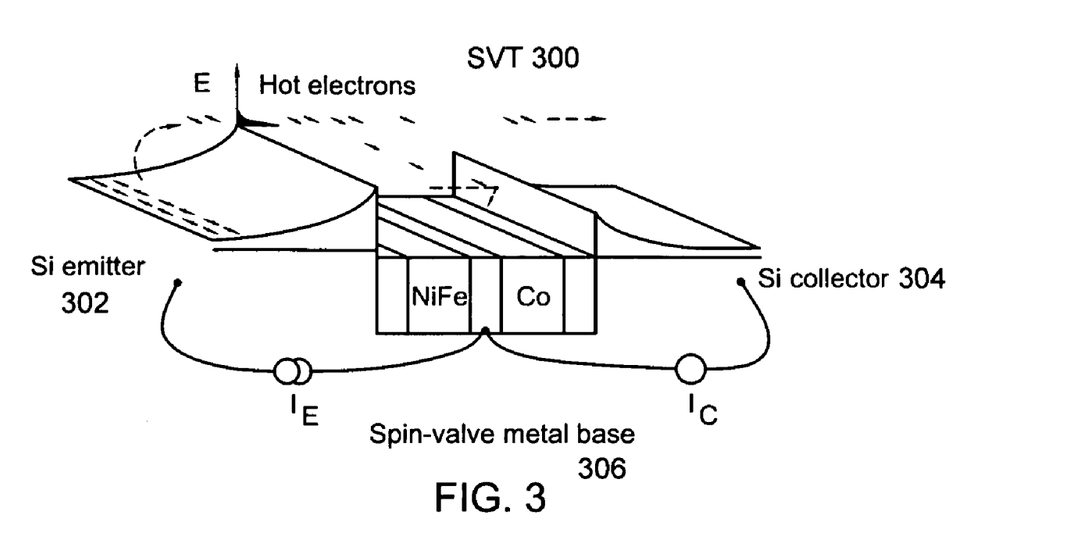
FIG. 3 is an illustration for general TTM operation.

FIG. 3 illustrates TTM operation associated with a spin valve transistor (SVT) 300 which has a semiconductor emitter region 302, a semiconductor collector region 304, and a base region 306 which contains a spin valve (SV). The semiconductors and magnetic materials used in SVT 300 may include an n-type silicon (Si) material for emitter 302 and collector 304, and a $Ni_{80}Fe_{20}/Au/Co$ spin valve for the region 306. Energy barriers, also referred to as Schottky barriers, are formed at the junctions between the metal base 306 and the semiconductors. It is desirable to obtain a high quality energy barrier at these junctions with good rectifying behavior. Therefore, thin layers of magnetic materials (e.g. platinum and gold) are oftentimes used at the emitter 302 and collector 304, respectively. Moreover, these thin layers separate the magnetic layers from the semiconductor materials.

A TTM operates when current is introduced between emitter region 302 and base region 306, denoted as IE in FIG. 3. This occurs when electrons are injected over the energy barrier and into base region 306 by biasing the emitter such that the electrons are perpendicular to the layers of the spin valve. Because the electrons are injected over the energy barrier, they enter base region 306 as non-equilibrium hot electrons, whereby the hot-electron energy is typically in the range of 0.5 and 1.0 eV depending upon the selection of the metal/semiconductor combination. The energy and momentum distribution of the hot electrons change as the electrons move through base region 306 and are subjected to inelastic and elastic scattering. As such, electrons are prevented from entering collector region 304 if their energy is insufficient to overcome the energy barrier at the collector side. Moreover, the hot-electron momentum must match with the available states in the collector semiconductor to allow for the electrons to enter collector region 304. The collector current $I_C$, which indicates the fraction of electrons collected in collector region 304, is dependent upon the scattering in base region 306 which is spin-dependent when base region 306 contains magnetic materials. Furthermore, an external applied magnetic field controls the total scattering rate which may, for example, change the relative magnetic alignment of the two ferromagnetic layers of the spin valve. The magnetocurrent (MC), which is the magnetic response of the TTM, can be represented by the change in collector current normalized to the minimum value as provided by the following formula: $MC=[I^P_{Pc}-I^P_C]/I^{AP}_C$, where P and AP indicate the parallel and antiparallel state of the spin valve, respectively.

Figure 4:
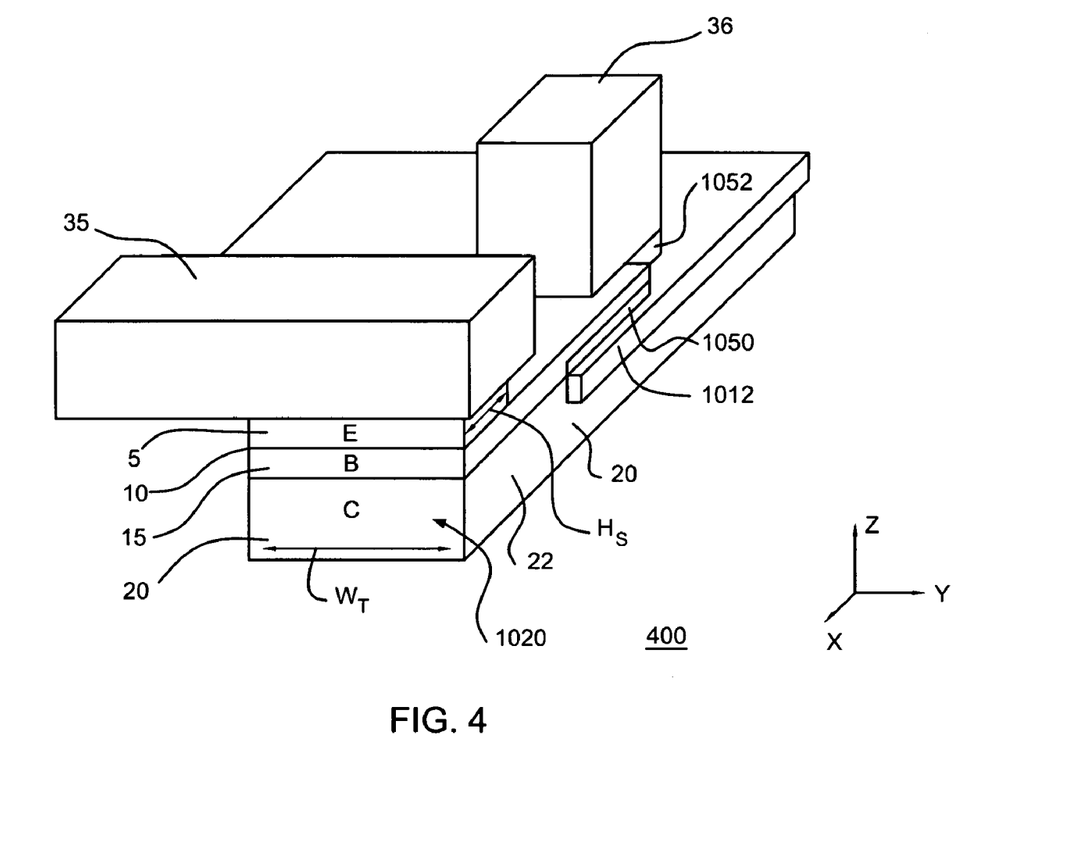
FIG. 4 is a perspective view of a TTM of the present application according to a first embodiment.

In FIG. 4, a three terminal magnetic sensor (TTM) 400 comprising a spin valve transistor (SVT) of the present application is shown. Although described as incorporating a SVT (where both barrier layers are Schottky barriers), the TTM may alternatively incorporate a magnetic tunnel transistor (MTT) (where one of the barrier layers is a Schottky barrier and the other barrier layer is a tunnel barrier), or a double junction structure (where both barrier layers are tunnel barriers).

TTM 400 of FIG. 4 has a base region 15, a collector region 20 which is adjacent base region 15, an emitter region 5, and a barrier region 10 which separates emitter region 5 from base region 15. As described in relation to FIG. 3, collector region 20 may be a semiconductor substrate made of silicon (Si). Base region 15 preferably includes at least one soft ferromagnetic (FM) material, such as nickel-iron (NiFe), cobalt-iron (CoFe), or cobalt (Co), as well as a very thin metal (e.g. gold) which is sandwiched in between the FM materials. Barrier layer 10 is a non-magnetic insulating material, preferably made of aluminum-oxide, which is generally less than 10 Angstroms (Å) in thickness.

As indicated in FIG. 4, a trackwidth $W_T$ of the magnetic head is defined by the dimension of emitter region 5, base region 15, and collector region 20 along the y-axis, while a stripe height $H_S$ of the magnetic head is defined by the dimension of emitter region 5 along the x-axis. A sensing plane 1020 of TTM 400 is defined along sides of base region 15, collector region 20, and emitter region 5. This sensing plane 1020 is at an air bearing surface (ABS) when TTM 400 is embodied in a magnetic head. A non-magnetic insulator layer 1012 is offset behind sensing plane 1020 and adjacent collector region 20 and base region 15. Insulator layer 1012 may be, for example, an oxide materials such as alumina. An emitter lead 35, which may be embodied as a ferromagnetic (FM) shield for TTM 400, is positioned in contact with emitter region 5 at sensing plane 1020. Emitter lead 35 serves as the electrical connection for emitter region 5 to an external lead (not visible in FIG. 4). A base lead 36 is positioned in contact with base region 15 behind sensing plane 1020. Base lead 36 and a collector lead (not visible in FIG. 4) are preferably not formed along sensing plane 1020. Note that additional or alternative leads may be formed in the TTM, which has at least three leads.

The TTM allows hot electrons emitted from emitter region 5 to travel through to base region 15 to reach collector region 20, which collects the magnetocurrent (i.e. collects the electrons). In operation, the device acts as a hot spin electron filter whereby barrier region 10 between emitter region 5 and base region 15 operates to selectively allow the hot electrons to pass on through to base region 15 and then on through collector region 20. When TTM 400 is not functioning, the device is in a known magnetic quiescent state. In this case, the magnetization of the free layer which comprises all or part of base region 15 is parallel to the ABS plane. The direction of this magnetization depends on the direction of the magnetic field produced by a pinned layer (not visible) formed adjacent the free layer. The scattering of electrons within the free layer is dependent upon the orientation of the magnetization within the free layer. For example, if the magnetization is pointing in the parallel direction relative to the pin layer (i.e. parallel to the ABS plane), then the electrons are not scattered as much as compared to the case where the free layer is antiparallel relative to the pin layer. The performance of the device may be different depending upon the relative configuration of emitter region 5, the free layer, and the hard bias layer.

Since it is advantageous to form a very thin base region 15 (e.g. between about 20-200 Å) for increased areal recording densities, base region 15 will have a relatively large electrical resistance if nothing is done to reduce it. With the trackwidth (TW) of the magnetic head being defined at between about 10 and 100 nanometers (nm) (e.g. approximately 50 nm), the electrical resistance of base region 15 may be much greater than 100 Ω. Thus, as the sense current passes through base region 15 from emitter lead 35 to base lead 36, base region 15 may be vulnerable to damage or failure (e.g. it could "blow" like a fuse). A relatively large resistance of base region 15 also raises the noise floor for the TTM 400 such that a much larger input signal for TTM 400 would be required for suitable operation. As apparent, there is a need to solve such problems so that TTM 400 may be suitable for use in magnetic heads and other devices.

Accordingly, a metal layer 1050 is formed in TTM 400 so as to be offset from sensing plane 1020 and in-plane and in contact with magnetic materials of base region 15. In the embodiment of FIG. 4, metal layer 1050 is formed in contact with insulator layer 1012 but not in contact with base lead 36. This metal layer 1050 is thicker than any other metal film which may be formed within base region 15 itself; metal layer 1050 is preferably formed to a thickness of between 50-500% (at least 50%) of the total thickness of base region 15. For example, metal layer 1050 may be formed to a thickness of between about 100-1000 Å. Note that metal layer 1050 stops where insulator layer 1012 ends; it does not extend over collector region 20. If a metal were formed over a collector via 22 where collector region 20 meets base region 15, it would cause a short between the two leads.

As an alternative to or in combination with metal layer 1050, TTM 400 of FIG. 4 also shows that a metal layer 1052 may be formed adjacent and between (in contact with) insulator layer 1012 and base lead 36. In addition, an alternative TTM 500 of FIG. 5 shows that metal layer 1050 may be alternatively formed along a top surface of base region 15 and in contact with base lead, not formed in contact with insulator layer 1012, and otherwise being the same as that shown and described in relation to FIG. 4.

Figure 5:
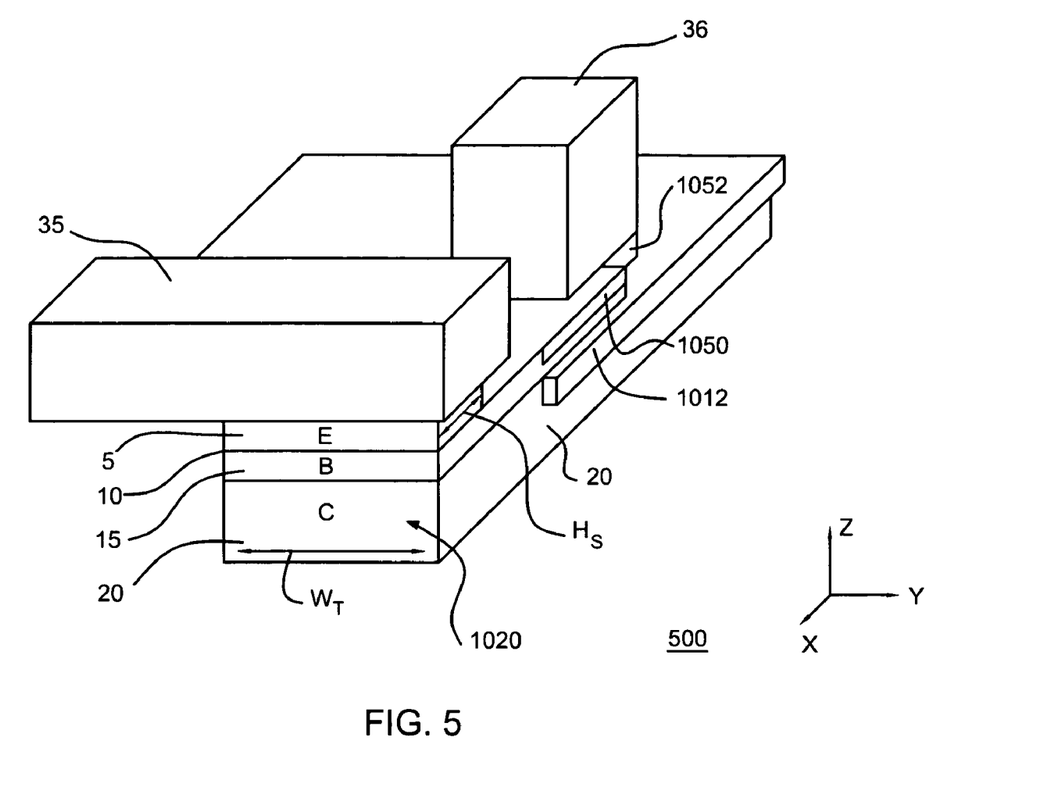
FIG. 5 is a perspective view of a TTM of the present application according to a second embodiment.

Such metal layers of FIGS. 4 and 5 reduce the electrical resistance of base region 15. This is advantageous as it serves to reduce signal noise in TTM 400 by lowering the noise floor. Preferably, metal layer 1050 has an electrical resistivity of less than 10 μΩ-centimeter (cm). For example, metal layer 1050 may be made of copper (Cu), gold (Au), ruthenium (Ru), alloys and/or combinations thereof. Copper has an approximate electrical resistivity of 2 μΩ-cm, gold has an approximate electrical resistivity of 5 μΩ-cm, and ruthenium has an approximate electrical resistivity of 7 μΩ-cm. In comparison, base region 15 alone with magnetic materials (e.g. ferromagnetic (FM) materials such as nickel-iron (NiFe) and cobalt-iron (CoFe) may have an electrical resistivity of between about 18-40 μΩ-cm. On the other hand, the electrical resistivity of combined materials for base region 15 and metal layer 1050 may be between about 2-18 μΩ-cm. As a result, the combined layer may have a combined electrical resistance of between about 5-100 Ω.

Figure 6:
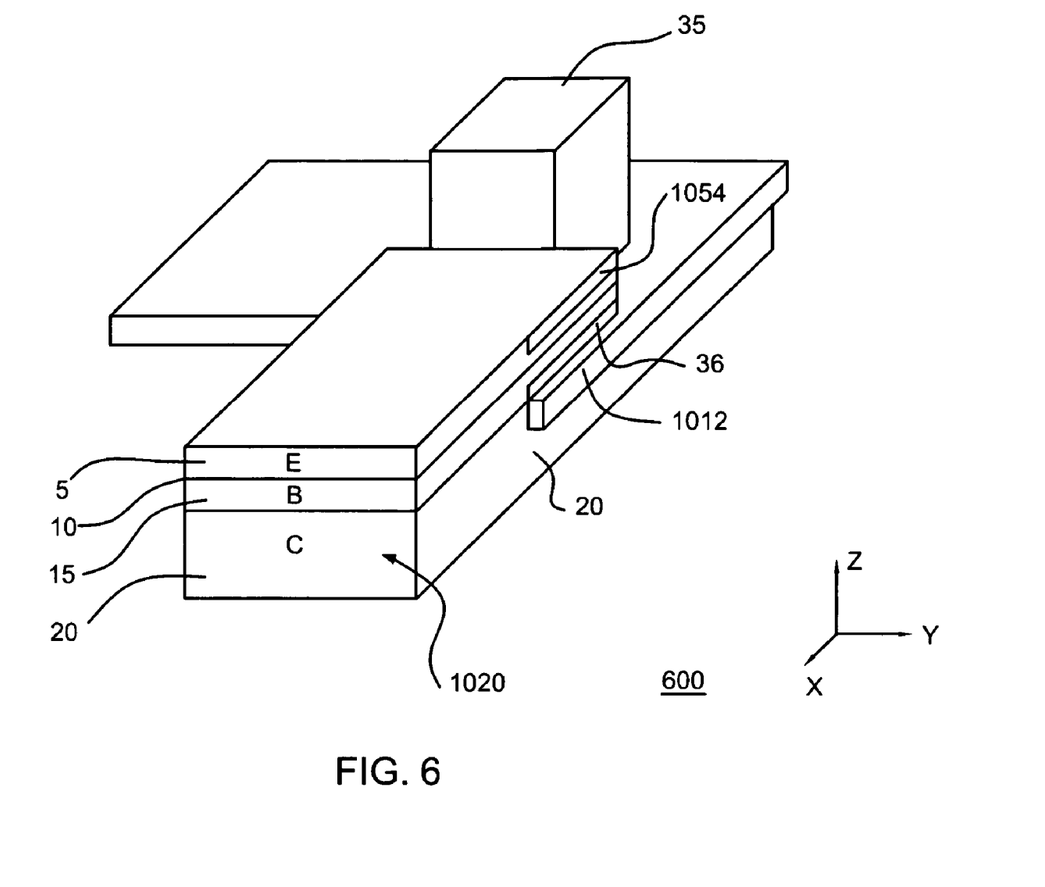
FIG. 6 is a perspective view of a TTM of the present application according to a third embodiment.

As an alternative to or in combination with the metal layers of FIG. 4 or 5, a TTM 600 of FIG. 6 shows that a metal layer 1054 may be formed in plane and in contact with magnetic materials of emitter region 5. This TTM 600 of FIG. 6 has a different construction than that shown and described in relation to FIGS. 4 and 5. Comparing the embodiment of FIG. 6 with that of FIG. 4, emitter region 5 extends much further behind sensing plane 1020. Emitter lead 35 of FIG. 6 is located where the previous base lead in FIG. 4 was formed and base lead 36 of FIG. 6 is located where the previous metal layer in FIG. 4 was formed. Again, this metal layer 1054 is formed in plane and in contact with magnetic materials of emitter region 5. Metal layer 1054 is also formed in contact with emitter lead 35. This metal layer 1054 is offset from sensing plane 1020 and does not make contact with collector region 20. Otherwise metal layer 1054 of FIG. 6 may be the same or similar to that described in relation to FIG. 4, where it reduces the electrical resistance of emitter region 5 with the same or similar results.

Figure 7A:
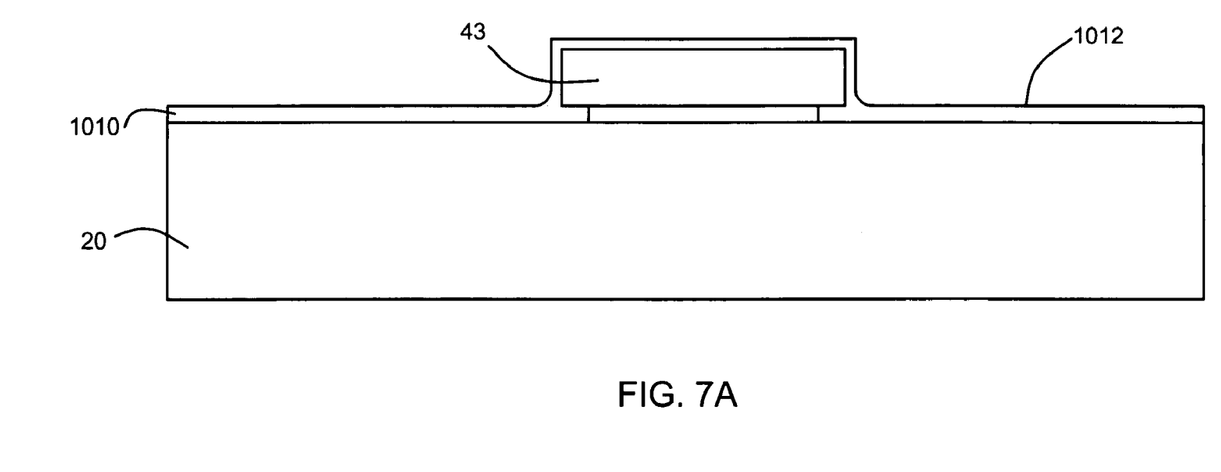
Figure 7B:
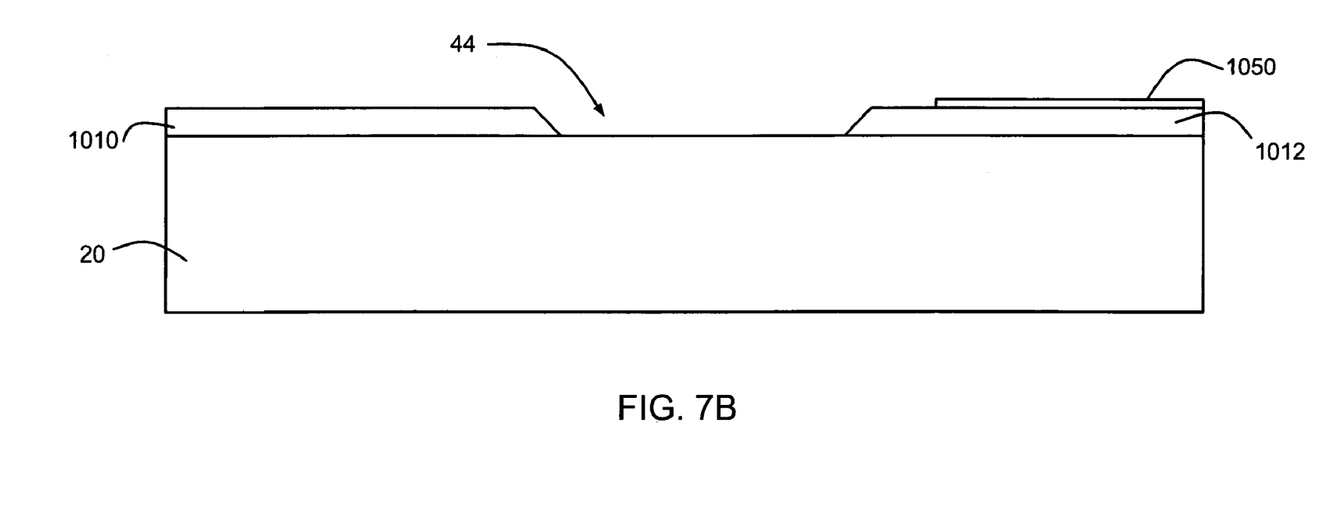
Figure 8A:
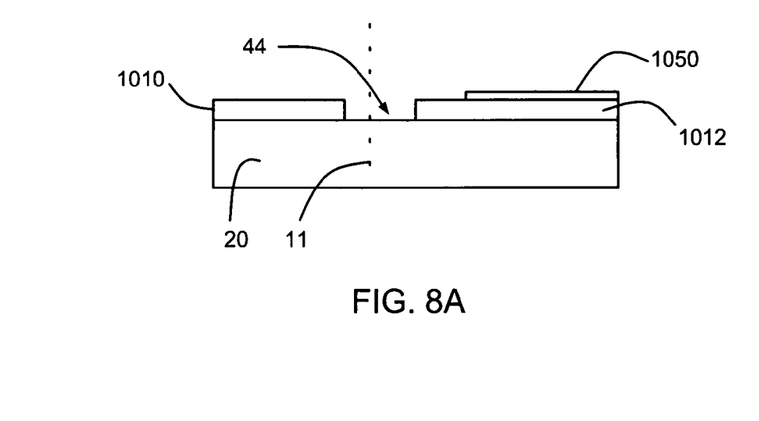
Figure 8B:
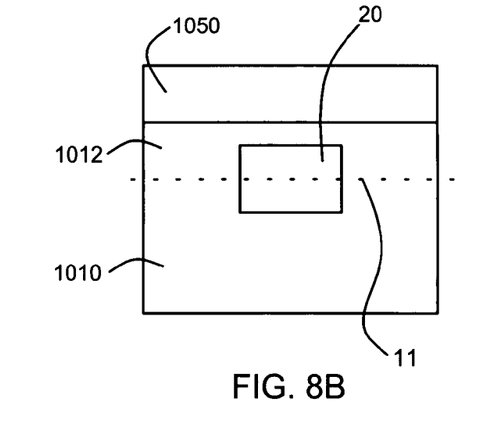

A TTM of the present application may be fabricated using lithographic techniques as now described. In the following description, a TTM of the type shown and described in relation to FIG. 4 is made. Referring to FIG. 7A, collector region 20 is shown with an insulating oxide layer 1010/1012 deposited thereon. A resist pattern 43 is then used to remove a middle portion of the insulating layer 1010/1012 which creates, as shown in FIG. 7B, a via 44 down to the semiconductor substrate 20 as well as insulating layers 1010 and 1012. The removal of the insulating layer materials may be performed using conventional etching techniques. Metal layer 1050 is then formed over at least a portion of insulating layer 1012. Metal layer 1050 may be formed using sputter-deposition or electroplating steps, as well as lithography steps with a patterned resist and etching. An air bearing surface (ABS) 11 of the sensor structure is represented by a dotted line in FIGS. 8A and 8B as well as in the subsequent drawings.

Figure 9A:
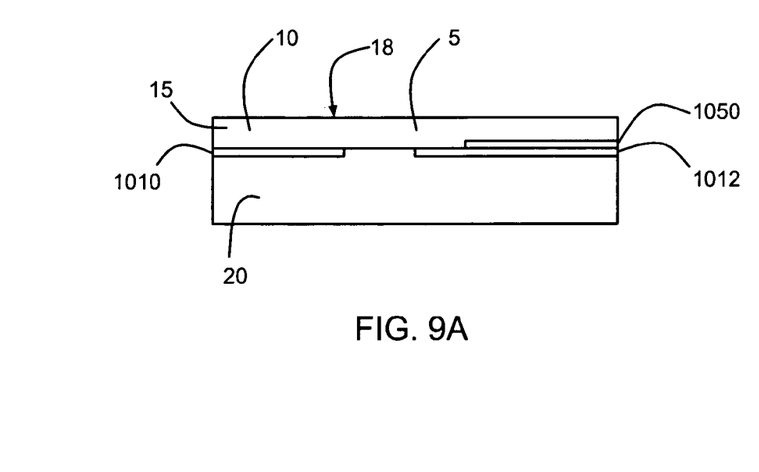
Figure 9B:
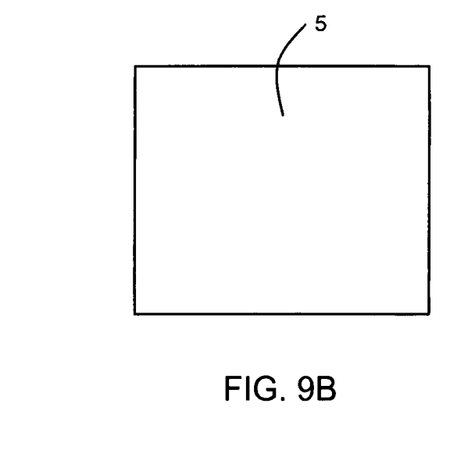
Figure 10A:
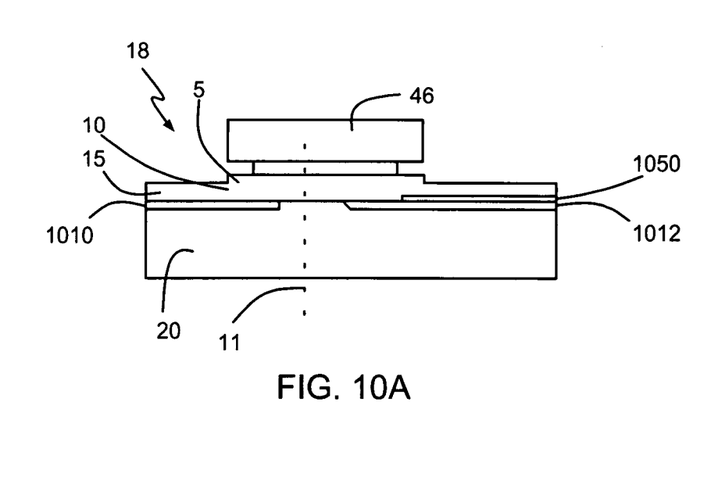
Figure 10B:
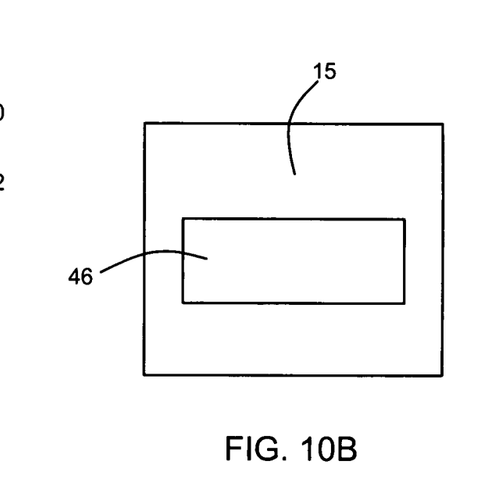
Figure 11A:
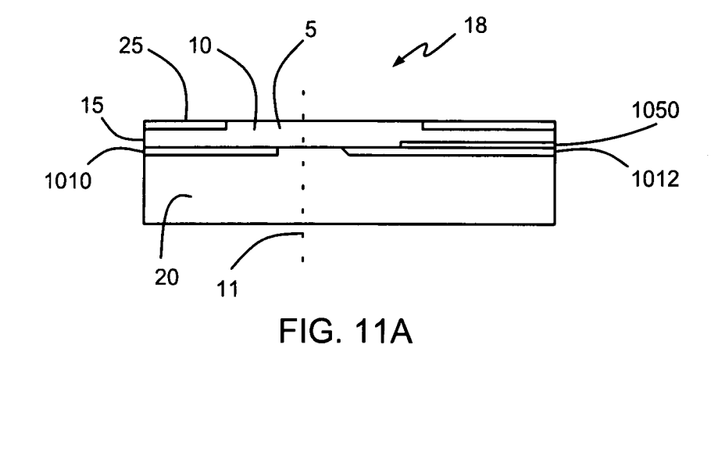
Figure 11B:
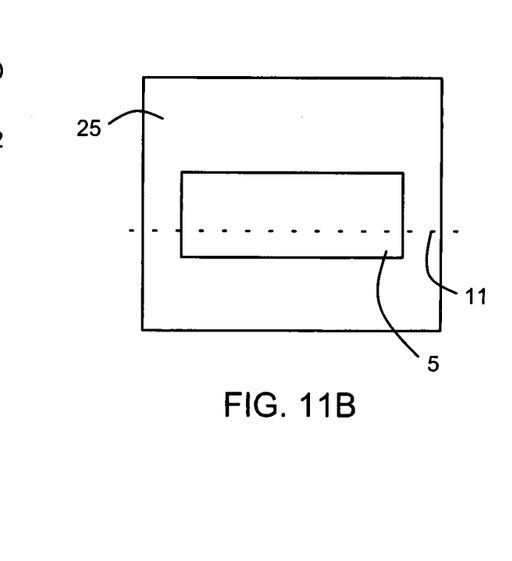

In FIG. 9A, a sensor stack 18 is formed over insulating layers 1010 and 1012, into via 44, and over metal layer 1050. Sensor stack 18 includes emitter region 5, barrier layer 10, and base region 15, from top to bottom. Base region 15 is formed over and in contact with metal layer 1050. The top-down view of FIG. 9B illustrates the upper cap of sensor stack 18, which is top the surface of emitter region 5. Next, as depicted in FIGS. 10A and 10B, another resist 46 is used to pattern sensor stack 18, where portions of emitter region 5 are removed using known techniques such as ion milling or reactive ion etching (RIE). This exposes base layer 15 along the sides and defines the stripe height Hs of the device. As shown in FIGS. 11A and 11B, an insulator 25 (such as alumina) is then filled in the areas over exposed base layer 15.

Figure 12A:
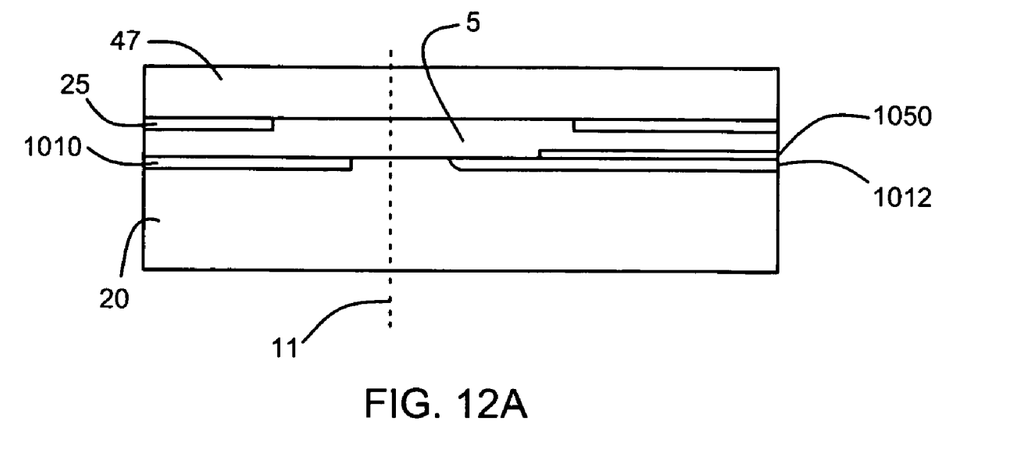
Figure 12B:
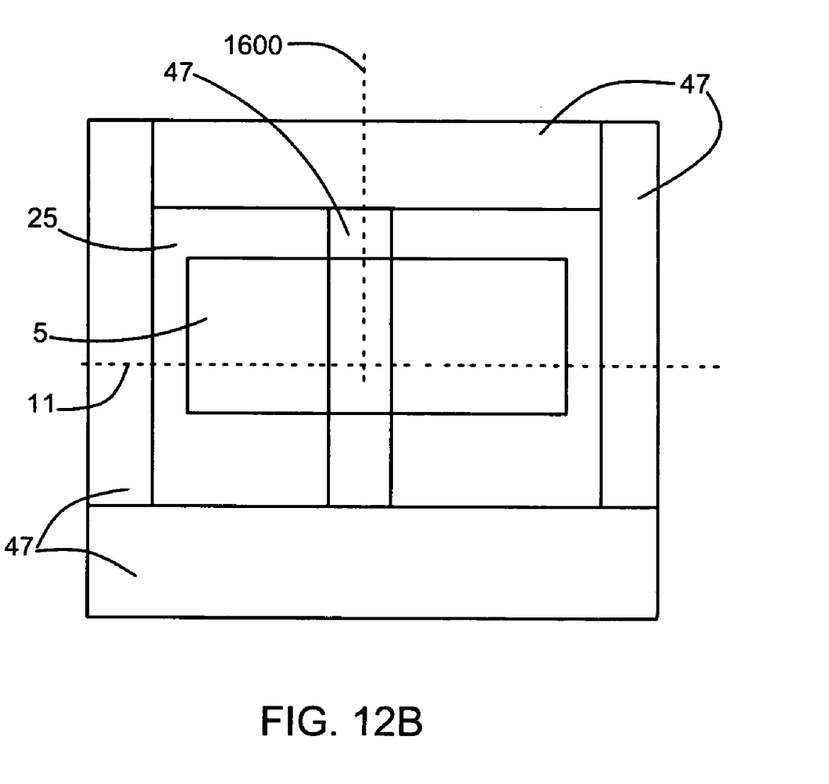
Figure 13A:
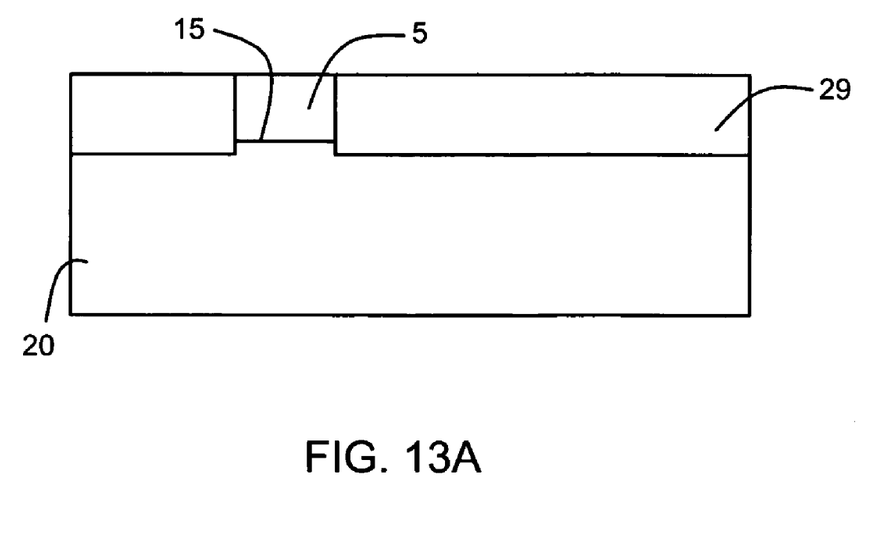
Figure 13B:
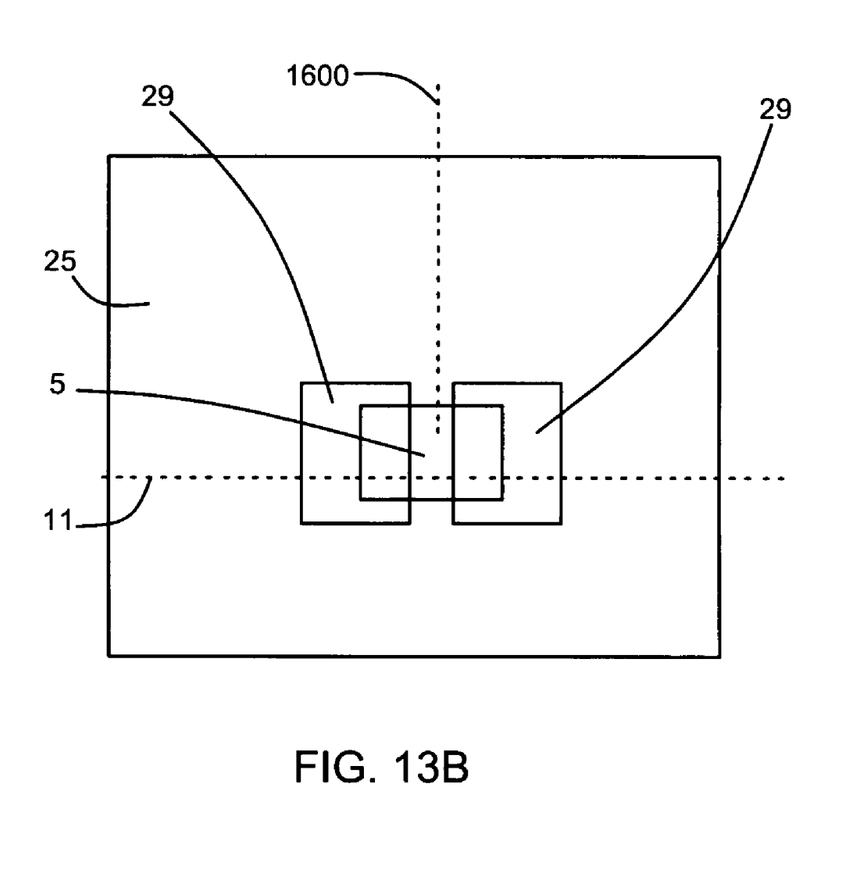
Figure 14A:
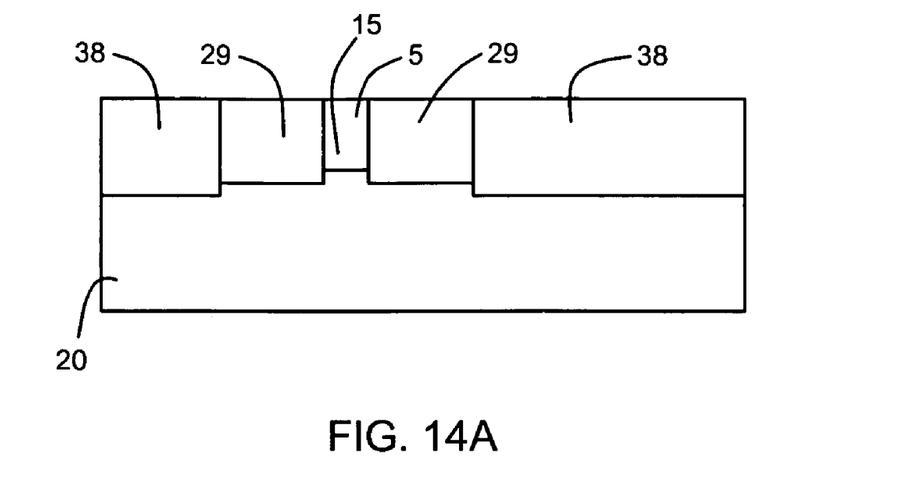
Figure 14B:
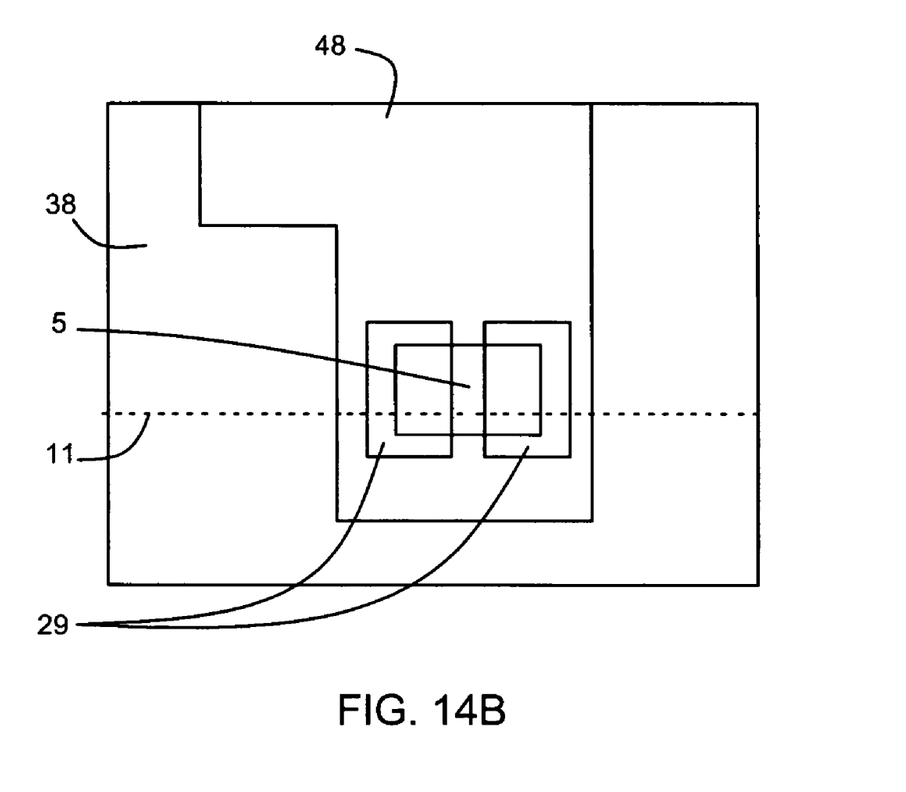
Figure 15A:
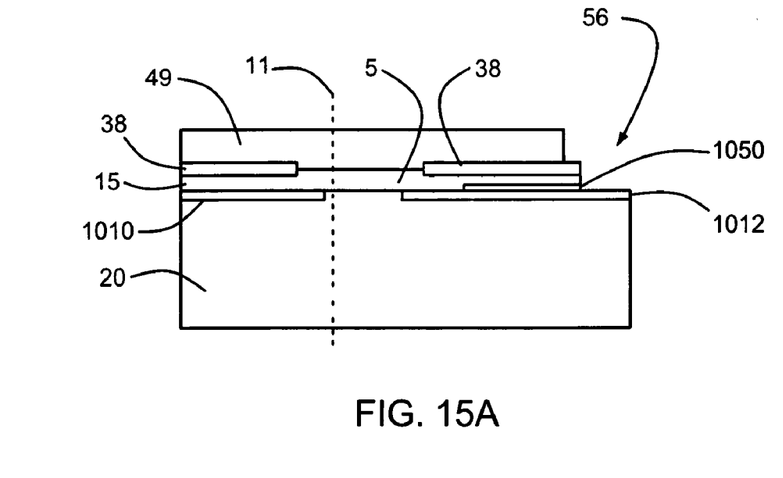
Figure 15B:
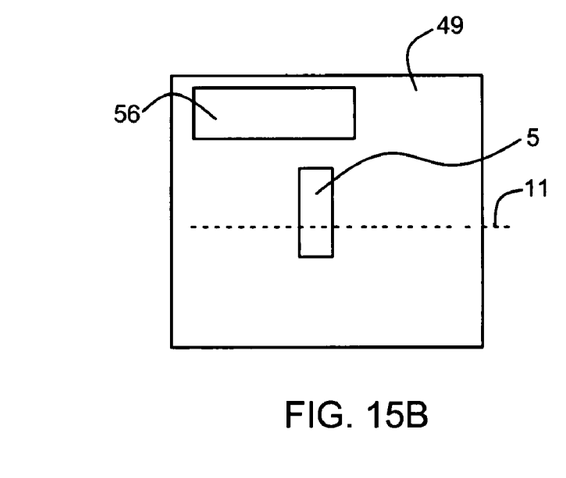
Figure 16A:
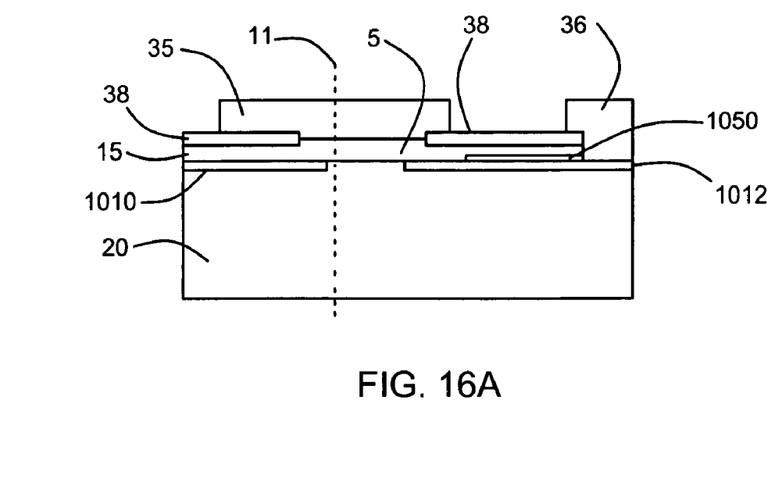
Figure 16B:
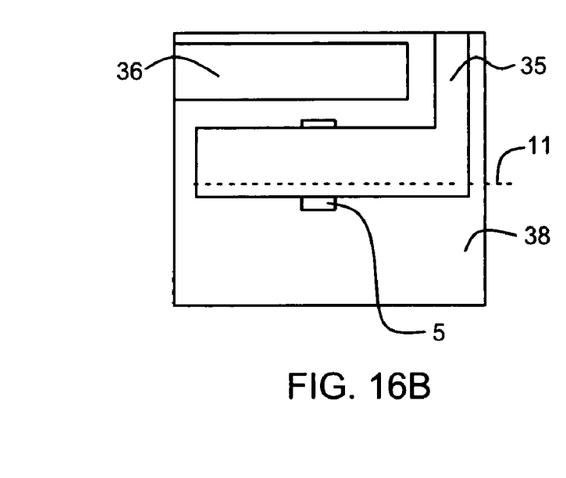

In the next stage of processing, as illustrated in FIGS. 12A and 12B, a patterned resist 47 is used to pattern the structure along a trackwidth (TW) axis 1600 with an etch. Patterned resist 47 is best viewed in the top-down view of FIG. 12B where the exposed portions of insulator 25 and emitter 5 are shown. Once the exposed material is removed, an insulating layer 25, a hard bias layer 30, and a non-magnetic layer 33 are deposited. Collectively, insulator 25, hard bias layer 30, and non-magnetic layer 33 form a stack 29 which is illustrated in the ABS view of FIG. 13A and a top plan view of FIG. 13B. In the ABS view of FIG. 14A and in FIG. 14B, portions of stack 29 are removed along with portions of refill alumina 25 and base region 15, such that only emitter region 5 and a remaining portion of base region 15 are located between insulator/bias/insulator stack 29. Another resist 48 is then used to pattern the device and an insulator 38 fills the exposed portions. FIGS. 15A and 15B illustrate the device where yet another resist 49 used to pattern (etch) a via 56 to base region 15 and a via (not visible) to collector region 20. This step may etch through metal layer 1050 as shown or, alternatively, not etch through metal layer 1050. After the patterning is completed, the transistor device is plated with emitter lead 35 and base lead 36 as shown in FIGS. 16A and 16B, wherein these leads 35, 36 are preferably made of nickel-iron (NiFe). Other leads, such as the collector lead (not shown) can also be included in this lead-plating step.

Final Comments. As described herein, a three terminal magnetic sensor (TTM) of the present application which is suitable for use in a magnetic head has a base region, a collector region which is adjacent the base region, an emitter region, and a barrier region which separates the emitter region from the base region. The TTM may comprise a spin valve transistor (SVT), a magnetic tunnel transistor (MTT), or a double junction structure. A sensing plane is defined along sides of the base region, the collector region, and the emitter region. An insulator layer is offset from the sensing plane and adjacent the collector region and the base region. A metal layer of the TTM is offset from the sensing plane and in-plane and in contact with magnetic materials of the base region. This metal layer reduces an electrical resistance of the base region, which reduces signal noise in the TTM. Preferably, the metal layer has an electrical resistivity of less than 10 $\mu\Omega$-centimeter (e.g. copper, gold, or ruthenium).

A magnetic head of the present application includes a TTM having a base region, a collector region which is adjacent the base region, an emitter region, and a barrier region which separates the emitter region from the base region. The TTM may comprise a spin valve transistor (SVT), a magnetic tunnel transistor (MTT), or a double junction structure. An air bearing surface (ABS) plane is defined along sides of the base region, the collector region, and the emitter region. An insulator layer is offset from the ABS plane and adjacent the collector region and the base region. A metal layer is offset from the ABS plane and in-plane and in contact with magnetic materials of the base region. Preferably, the metal layer has an electrical resistivity of less than 10 $\mu\Omega$-centimeter (e.g. copper, gold, or ruthenium). A disk drive of the present application includes a write head portion, a read head portion, and a slider which carries the write and the read head portion. The read head portion includes a TTM having a base region, a collector region which is adjacent the base region, an emitter region, and a barrier region which separates the emitter region from the base region. An ABS plane is defined along sides of the base region, the collector region, and the emitter region. An insulator layer is offset from the ABS plane and adjacent the collector region and the base region. A metal layer is offset from the ABS plane and in-plane and in contact with magnetic materials of the base region. Preferably, the metal layer has an electrical resistivity of less than 10 $\mu\Omega$-centimeter (e.g. copper, gold, or ruthenium).

In another illustrative example of the present invention, a three terminal magnetic sensor (TTM) suitable for use in a magnetic head has a base region, a collector region which is adjacent the base region, an emitter region having an emitter lead formed thereover, and a barrier region which separates the emitter region from the base region. A sensing plane is defined along sides of the base region, the collector region, and the emitter region. The TTM has a metal layer which is offset from the sensing plane, in-plane and in contact with the emitter region, and in contact with the emitter lead. This metal layer reduces an electrical resistance of the emitter region, which reduces signal noise in the TTM. Preferably, the metal layer has an electrical resistivity of less than 10 $\mu\Omega$-centimeter (e.g. copper, gold, or ruthenium).

It is to be understood that the above is merely a description of preferred embodiments of the invention and that various changes, alterations, and variations may be made without departing from the true spirit and scope of the invention as set for in the appended claims. For example, although the TTM is described as a three-leaded device, it may actually have three or more leads. Few if any of the terms or phrases in the specification and claims have been given any special particular meaning different from the plain language meaning to those ordinarily skilled in the art, and therefore the specification is not to be used to define terms in an unduly narrow sense.

What is claimed is:

1. A three terminal magnetic sensor (TTM), comprising:
   a base region;
   a collector region which is adjacent the base region;
   an emitter region;
   a barrier region which separates the emitter region from the base region;
   a sensing plane defined along sides of the base region, the collector region, and the emitter region;
   a base lead for conducting a sense current through the base region;
   an insulator layer which is:
      offset from the sensing plane;
      adjacent the collector region and the base region;
   a metal layer which is:
      offset from the sensing plane; and
      in-plane and in contact with magnetic materials of the base region, so that the base region of magnetic materials and the metal layer together form a planar body.

2. The TTM of claim 1, wherein the metal layer has an electrical resistivity less than 10 $\mu\Omega$-centimeters.

3. The TTM of claim 1, wherein the planar body which includes the base region and the metal layer has an electrical resistance between 5-100 ohms.

4. The TTM of claim 1, wherein the metal layer has a thickness comprising at least 50% of the thickness of the base region.

5. The TTM of claim 1, wherein the magnetic materials of the base region comprise ferromagnetic (FM) materials which include at least one of nickel-iron (NiFe) and cobalt-iron (CoFe).

6. The TTM of claim 1, wherein an electrical resistivity of the planar body which includes the base region and the metal layer is less than an electrical resistivity of the base region alone.

7. A magnetic head, comprising:
a three terminal magnetic (TTM) sensor;
the TTM having:
  a base region;
  a collector region which is adjacent the base region;
  an emitter region;
  a barrier region which separates the emitter region from the base region;
  an air bearing surface (ABS) plane defined along sides of the base region, the collector region, and the emitter region;
  a base lead for conducting a sense current through the base region;
  an insulator layer which is:
    offset from the ABS plane;
    adjacent the collector region and the base region;
  a metal layer which is:
    offset from the ABS plane; and
    in-plane and in contact with magnetic materials of the base regions so that the base region of magnetic materials and the metal layer together form a planar body.

8. The magnetic head of claim 7, wherein the metal layer has an electrical resistivity less than 10 $\mu\Omega$-centimeters.

9. The magnetic head of claim 7, wherein the planar body which includes the base region and the metal layer has an electrical resistance between 5-100 ohms.

10. The magnetic head of claim 7, wherein an electrical resistivity of the planar body which includes the base region and the metal layer is less than an electrical resistivity of the base region alone.

11. The magnetic head of claim 7, wherein the metal layer has a thickness comprising between at least 50% of the thickness of the base region.

12. A disk drive, comprising:
a magnetic head;
a slider which carries the magnetic head;
a write head portion of the magnetic head;
a read head portion of the magnetic head;
the read head portion including a three terminal magnetic sensor (TTM);
the TTM having:
  a base region;
  a collector region which is adjacent the base region;
  an emitter region;
  a barrier region which separates the emitter region from the base region;
  an air bearing surface (ABS) plane defined along sides of the base region, the collector region, and the emitter region;
  a base lead for conducting a sense current through the base region;
  an insulator layer which is:
    offset from the ABS plane;
    adjacent the collector region and the base region;
  a metal layer which is:
    offset from the ABS plane; and
    in-plane and in contact with magnetic materials of the base region, so that the base region of magnetic materials and the metal layer together form a planar body.

13. The disk drive of claim 12, wherein the metal layer has an electrical resistivity less than 10 $\mu\Omega$-centimeters.

14. The disk drive of claim 12, wherein the planar body which includes the base region and the metal layer has an electrical resistance between 5-100 ohms.

15. The disk drive of claim 12, wherein an electrical resistivity of the planar body which includes the base region and the metal layer is less than an electrical resistivity of the base region alone.

16. The disk drive of claim 12, wherein the metal layer has a thickness comprising at least 50% of the thickness of the base region.

17. A three terminal magnetic sensor (TTM) for a magnetic head, the TTM comprising:
  a base region;
  a collector region which is adjacent the base region;
  an emitter region having an emitter lead formed thereover;
  a barrier region which separates the emitter region from the base region;
  a sensing plane defined along sides of the base region, the collector region, and the emitter region;
  a metal layer which is:
    offset from the sensing plane;
    in-plane and in contact with the emitter region, so that the emitter region and the metal layer together form a planar body; and
    in contact with the emitter lead.

18. The TTM of claim 17, wherein the metal layer has an electrical resistivity less than 10 $\mu\Omega$-centimeters.

19. The TTM of claim 17, wherein the metal layer has a thickness comprising at least 50% of the thickness of the emitter region.

20. A disk drive, comprising:
a magnetic head;
a slider which carries the magnetic head;
a write head portion of the magnetic head;
a read head portion of the magnetic head;
the read head portion including a three terminal magnetic sensor (TTM);
the TTM having:
  a base region;
  a collector region which is adjacent the base region;
  an emitter region having an emitter lead formed thereover;
  a barrier region which separates the emitter region from the base region;
  a sensing plane defined along sides of the base region, the collector region, and the emitter region;
  a metal layer which is:
    offset from the sensing plane;
    in-plane and in contact with the emitter region, so that the emitter region and the metal layer together form a planar body; and
    in contact with the emitter lead.

21. The disk drive of claim 20, wherein the metal layer has an electrical resistivity less than 10 $\mu\Omega$-centimeters.

22. The disk drive of claim 20, wherein the metal layer has a thickness comprising at least 50% of the thickness of the emitter region.

* * * * *

UNITED STATES PATENT AND TRADEMARK OFFICE
CERTIFICATE OF CORRECTION

PATENT NO. : 7,336,449 B2 Page 1 of 1
APPLICATION NO. : 10/955758
DATED : February 26, 2008
INVENTOR(S) : Jeffrey Scott Lille It is certified that error appears in the above-identified patent and that said Letters Patent is hereby corrected as shown below:

On the Title Page, Item (73) assignee please change "Eitachi Global Storage Technologies Netherlands B.V." to --Hitachi Global Storage Technologies Netherlands B.V.--

Signed and Sealed this

Seventeenth Day of June, 2008

JON W. DUDAS
*Director of the United States Patent and Trademark Office*